United States Patent
Kang

(10) Patent No.: US 8,013,529 B2
(45) Date of Patent: Sep. 6, 2011

(54) PLASMA DISPLAY DEVICE

(75) Inventor: Hyun-Chang Kang, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 504 days.

(21) Appl. No.: 11/984,740

(22) Filed: Nov. 21, 2007

(65) Prior Publication Data

US 2008/0123272 A1    May 29, 2008

(30) Foreign Application Priority Data

Nov. 27, 2006  (KR) .................. 10-2006-0117638

(51) Int. Cl.
  *H01J 17/49*  (2006.01)
(52) U.S. Cl. ........................ 313/583; 313/582
(58) Field of Classification Search .......... 313/582–587; 345/37, 41, 60, 71
  See application file for complete search history.

(56) References Cited

U.S. PATENT DOCUMENTS

| | | | |
|---|---|---|---|
| 2001/0033009 A1* | 10/2001 | Inoue et al. | 257/668 |
| 2005/0068261 A1* | 3/2005 | Oh | 345/60 |
| 2005/0122019 A1* | 6/2005 | Bae | 313/46 |
| 2005/0212426 A1* | 9/2005 | Ahn | 313/582 |
| 2005/0237275 A1* | 10/2005 | Inoue et al. | 345/60 |
| 2006/0077129 A1 | 4/2006 | Kim et al. | |
| 2006/0125720 A1 | 6/2006 | Kim et al. | |
| 2006/0158835 A1* | 7/2006 | Lin et al. | 361/681 |
| 2006/0232513 A1* | 10/2006 | Lee et al. | 345/60 |
| 2006/0291153 A1 | 12/2006 | Bae | |

FOREIGN PATENT DOCUMENTS

| | | |
|---|---|---|
| CN | 1 787 045 A | 6/2006 |
| JP | 11-282000 | 10/1999 |
| JP | 2005-072517 | 3/2005 |
| KR | 10-2005-0072364 A | 4/2005 |
| KR | 20050118954 * | 1/2006 |
| KR | 10-2006-0097984 A | 9/2006 |
| KR | 10-2006-0105994 A | 10/2006 |

* cited by examiner

*Primary Examiner* — Peter J Macchiarolo
*Assistant Examiner* — Donald L Raleigh
(74) *Attorney, Agent, or Firm* — Lee & Morse, P.C.

(57) ABSTRACT

A plasma display device includes a plasma display panel having a front panel, a rear panel, and a plurality of address electrodes therebetween, a chassis base affixed to the rear panel of the plasma display panel, a plurality of printed circuit boards which on the chassis base, each printed circuit board electrically connected to the electrodes via a flexible printed circuit, and an insert member between the chassis base and the printed circuit boards.

17 Claims, 6 Drawing Sheets

PLASMA DISPLAY DEVICE

BACKGROUND OF THE INVENTION

1. Field of the Invention

The present invention relates to a plasma display device. More particularly, the present invention relates to a plasma display device having an improved structure capable of minimizing impurities dispersion into a flexible printed circuit of a plasma display panel.

2. Description of the Related Art

Generally, a plasma display device is a flat display device capable of displaying images using gas discharge phenomenon, thereby providing superior display properties such as high brightness and contrast, lack of residual image, wide viewing angles, and a thin display structure. The conventional plasma display device may include a plasma display panel (PDP), a chassis base affixed to the PDP for support, and a plurality of printed circuit boards (PCBs) mounted on the chassis base and electrically connected to the PDP.

The conventional PDP may include two glass substrates with a discharging space and a plurality of phosphors therebetween. A predetermined amount of electricity may be applied to the PDP to generate plasma through gas discharge and, thereby, to emit vacuum ultraviolet (VUV) rays. The VUV rays may excite the phosphors between the substrates to emit visible light, i.e., red (R), green (G), or blue (B) light obtained by stabilizing the excited phosphors, to form images.

The conventional chassis base may be made of metal to supply mechanical rigidity to the PDP, e.g., may prevent any damage to the glass substrates of the PDP due to external impact. A front surface of the chassis base may be affixed to the PDP via a double sided tape, and the PCBs may be mounted on a rear surface of the chassis base via coupling of screws and bosses, i.e., a plurality of bosses may be formed on the rear surface of the chassis base, so the PCBs may be mounted thereon and secured thereto via screws.

The conventional PCBs may drive the PDP. Specifically, the PCBs may include a sustain board for controlling a plurality of sustain electrodes, a scan board for controlling a plurality of scan electrodes, and a horizontally disposed address buffer board for controlling a plurality of address electrodes. Additionally, the PCBs may include an image processing/control board to receive external image signals and generate control signals for driving the address, sustain and scan electrodes. The PCBs may also include a power board for power supply.

Each board of the conventional PCB may be connected to a plurality of respective electrodes, i.e., the address buffer board may be connected to the address electrodes through flexible printed circuits (FPCs) and connectors. The FPC connecting the address buffer board to the address electrodes may form a driver integrated circuit (IC) package, e.g., a tape carrier package (TCP), for generating an address pulse to be applied to the address electrodes. The driver IC package connecting the address buffer board to the address electrodes may be disposed horizontally along lower edges of the plasma display device in a bent form, so that one end of the driver IC package may be in communication with the PDP and another end of the driver IC package may be bent over the chassis base to be in communication with the address buffer board. The driver IC package may include two adhesive films and a metal circuit pattern therebetween for applying voltage/current between the circuit boards and the electrodes of the PDP.

However, the horizontal structure of the address buffer board along a lower part of the chassis base and apart therefrom may provide formation of the driver IC at a bottom of the plasma display device. In other words, the driver IC may be positioned to connect between lower horizontal edges of the address buffer board, chassis base, and PDP, so that a space may be formed therebetween. Accordingly, impurities dispersed from each board mounted on the chassis base due to the vibration of circuit elements may drop onto the driver IC package, thereby causing contamination and defects. Accordingly, there exists a need for a plasma display device structure capable of minimizing driver IC package contamination due to impurities dispersion.

SUMMARY OF THE INVENTION

The present invention is therefore directed to a plasma display device, which substantially overcomes one or more of the disadvantages of the related art.

It is therefore a feature of an embodiment of the present invention to provide a plasma display device structure capable of minimizing an amount of impurities introduced into an IC package or a FPC connecting a plasma display panel to a PCB.

At least one of the above and other features and advantages of the present invention may be realized by providing a plasma display device, including a plasma display panel having a front panel, a rear panel, and a plurality of address electrodes therebetween, a chassis base affixed to the rear panel of the plasma display panel, a plurality of printed circuit boards on the chassis base, each printed circuit board electrically connected to the electrodes via a flexible printed circuit, and an insert member between the chassis base and the printed circuit boards.

The printed circuit boards may include an address buffer board connected to the address electrodes. The address buffer board may be connected to the address electrodes through a flexible printed circuit having a driver IC.

The insert member may include an insert portion between the chassis base and the printed circuit board, and a stopper in communication with the insert portion and an upper surface of the printed circuit board. The insert portion may have a first thickness substantially equal to a distance between the chassis base and the printed circuit board. The stopper may have a second thickness greater than a distance between the chassis base and the printed circuit board. The insert portion may include inserting grooves corresponding to respective bosses in the chassis base. The insert member may include an insulating material.

In addition, the plasma display device may include a vibration blocking member between the insert member and the printed circuit board. A sum of a first thickness of the insert portion and a third thickness of the vibration blocking member may substantially equal to a distance between the chassis base and the printed circuit board. The vibration blocking member may be an insulator. The insert member may include a conductive material.

The printed circuit board may have a first ground pattern electrically connected to the insert member by a screw. Alternatively, the printed circuit board may have a second ground pattern on at least a portion of a surface of the printed circuit board.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
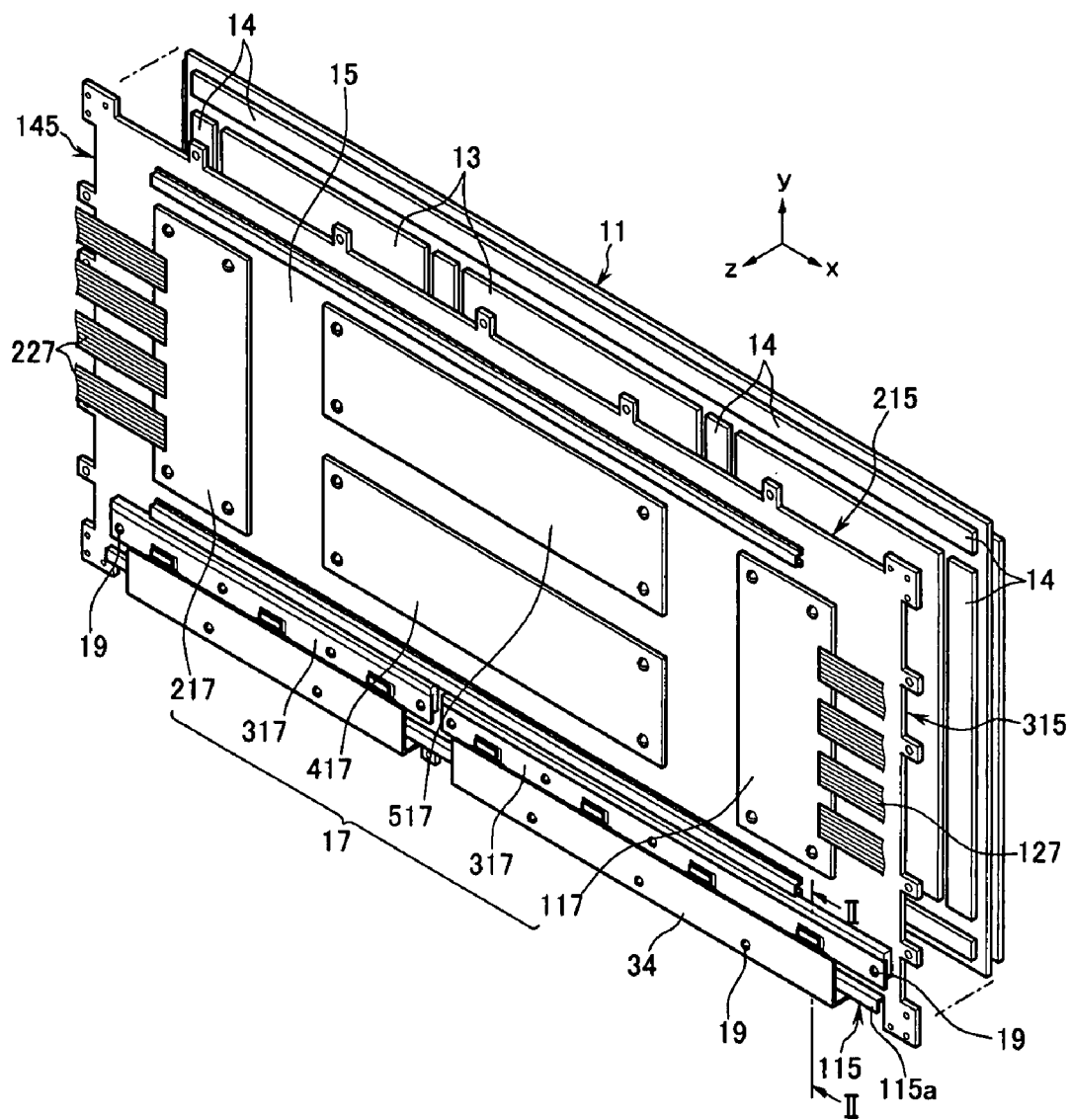
FIG. 1 illustrates a perspective exploded view of a plasma display device according to an embodiment of the present invention.

Korean Patent Application No. 10-2006-0117638 filed on Nov. 27, 2006, in the Korean Intellectual Property Office, and entitled: "PLASMA DISPLAY DEVICE," are incorporated by reference herein in their entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of elements and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, or one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
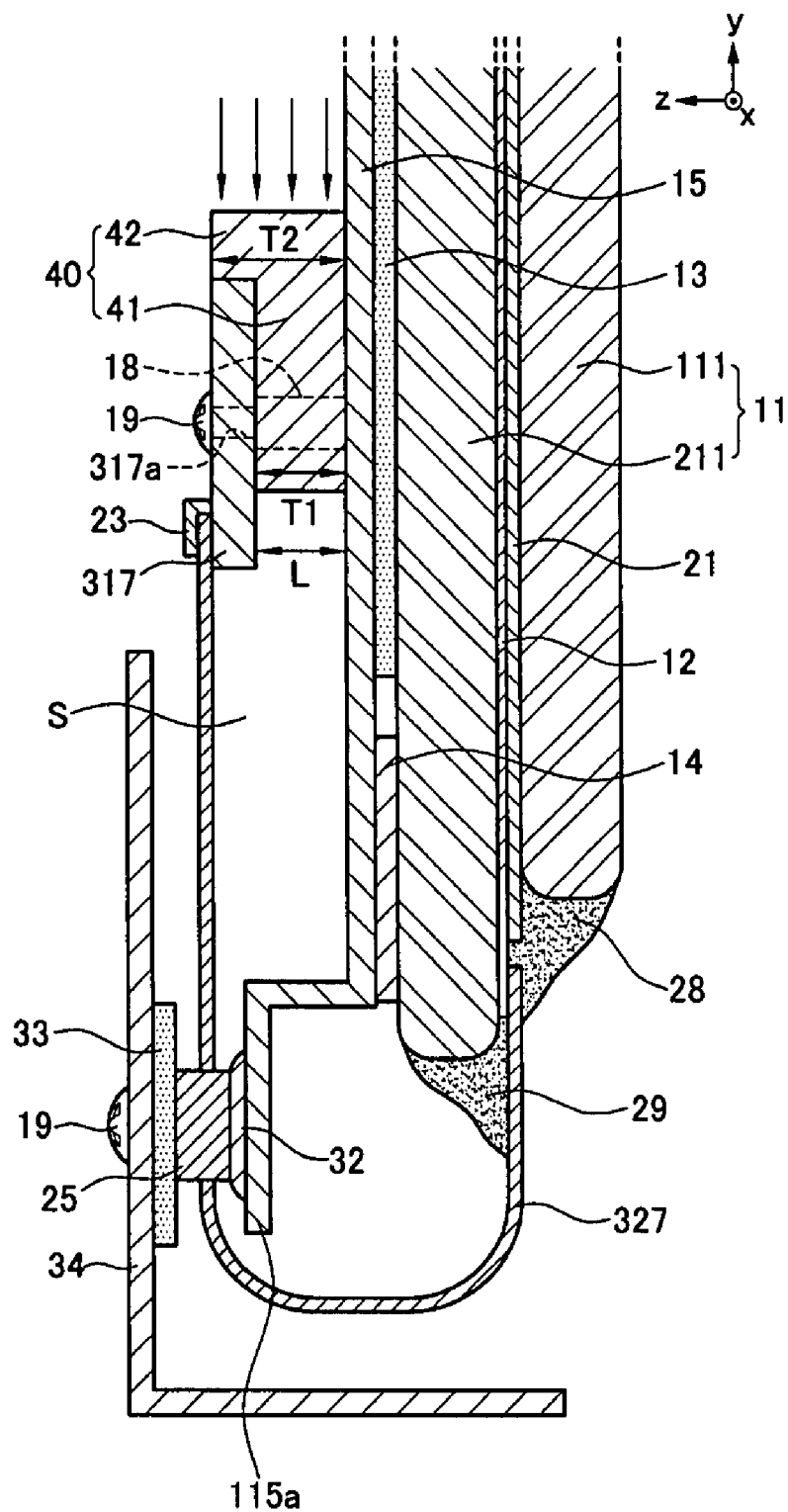
FIG. 2 illustrates a cross sectional view taken along line II-II of FIG. 1.

An exemplary embodiment of a plasma display device according to the present invention is more fully described below with reference to FIGS. 1-2. As illustrated in FIGS. 1-2, a plasma display device according to an embodiment of the present invention may include a plasma display panel (PDP) 11 having a front panel 111 and a rear panel 211 for displaying images, at least one heat dissipating sheet 13, a chassis base 15, a plurality of printed circuit boards (PCBs) 17, and an insert member 40. The PDP 11 may be any known PDP in the art, and therefore, its detailed description will be omitted.

The at least one heat dissipating sheet 13 of the plasma display device may be disposed on the rear panel 211 of the PDP 11. The heat dissipating sheet 13, and preferably a plurality of heat dissipating sheets 13, may conduct and diffuse heat generated in the PDP 11 in a planar direction. The heat dissipating sheet 13 may be made of an acrylic heat dissipating material, a graphite heat dissipating material, a metallic heat dissipating material, or a carbon nanotube heat dissipating material.

The chassis base 15 of the plasma display device may be disposed on a rear surface of the PDP 11 via a double sided tape 14, such that the heat dissipating sheets 13 may be positioned between a rear surface of the PDP 11 and a front surface of the chassis base 15. In this respect, it should be noted, however, that a minute space (not shown) may be formed between the chassis base 15 and the heat dissipating sheets 13 to provide for sufficient heat diffusion and dissipation from the PDP 11 through the heat dissipating sheet 13. The chassis base 15 may have sufficient mechanical rigidity to support the PDP 11. In addition, the chassis base 15 may have a substantially rectangular plate shape corresponding to the PDP 11, i.e., first and second parallel long sides 115 and 215 and two first and second parallel short sides 315 and 415 positioned perpendicularly to the first and second long sides 115 and 215.

The plurality of PCBs 17 may be positioned on a rear surface of the chassis base 15, i.e., such that the chassis base 15 may be positioned between the PDP 11 and the PCBs 17, to drive the PDP 11. In particular, each PCB 17 may be mounted on a predetermined position of the rear surface of the chassis base 15 and electrically connected to the PDP 11. For example, each PCB 17 may be mounted on at least one boss 18 formed in the chassis base 15, so that a screw 19 may be inserted through a hole in the PCB 17 into the boss 18, as illustrated in FIG. 2.

The plurality of PCBs 17 may include circuit boards having different functionalities and spaced apart from one another. For example, the PCBs 17 may include a sustain board 117 for controlling a plurality of sustain electrodes (not shown), a scan board 217 for controlling a plurality of scan electrodes (not shown), and an address buffer board 317 for controlling a plurality of address electrodes 12. The sustain board 117, scan board 217 and address buffer board 317 may be connected to respective electrodes via first, second and third FPCs 127, 227 and 327, respectively. The PCBs 17 may also include an image processing/control board 417 capable of receiving image signals from outside the plasma display device and of generating control signals for driving the address electrodes 12, sustain electrode and scan electrodes. In addition, the PCBs 17 may include a power board 517 for supplying power to the sustain board 117, scan board 217, address buffer board 317, and image processing/control board 417.

The sustain and scan boards 117 and 217 may be positioned vertically, i.e., long edges thereof may be parallel to the first and second short sides 315 and 415 of the chassis base 15, so that the sustain board 117 may be adjacent to the first short side 315 and the scan board 217 may be adjacent to the second short side 415. Accordingly, a plurality of first and second FPCs 127 and 227 may extend horizontally from respective sustain and scan boards 117 and 217, bend around an adjacent short side, i.e., first or second short side 315/415, respectively, and connect to respective electrodes in the PDP 11.

The address buffer board 317 may be positioned horizontally along a lower portion of the chassis base 15, i.e., adjacent and parallel to the first long side 115. In particular, as illustrated in FIG. 2, the address buffer board 317 may be disposed on the bosses 18 of the chassis base 15 and fixed thereto by inserting screws 19 through engaging holes 317a formed on the address buffer board 317 into the bosses 18. A predetermined distance L may be maintained between the address buffer board 317 and the chassis base 15.

The address electrodes 12 may be positioned between the rear and front panels 111 and 211 of the PDP 11 and be partially coated with a dielectric layer 21. In particular, each electrode 12 may be on the rear panel 211, while a portion of a front surface of the electrode 12 may be coated with the dielectric layer 21, i.e., the dielectric layer 21 may be between the electrode 12 and the front panel 111, as illustrated in FIG. 2. The front and rear panels 111 and 211 may be parallel to one another, while the front panel 111 may be shorter, i.e., as measured along a y-axis, than the rear panel 211.

A plurality of third FPCs 327 may extend vertically from the address buffer board 317, bend around the first long side 315 of the chassis base 15, and connect to the address electrodes 12. In particular, a first end of the third FPC 327 may be connected to a lower portion of the front surface of the address electrode 12, as illustrated in FIG. 2. The "lower portion of the front surface of the electrode 12" refers to a segment of the electrode 12 that may not be coated with the dielectric layer 21. The second end of the third FPC 327 may be connected to a connector 23 included in the address buffer board 317. The third FPC 327 may be bent around a lower edge of the chassis base 15 to form an enclosed space S. A bent of the third FPC 327 may be below the space S.

First and second sealing materials 28 and 29, as further illustrated in FIG. 2, may be deposited in communication with the first end of the third FPC 327 to minimize contact of moisture and impurities therewith. More specifically, the first sealing material 28 may be deposited on a lower surface of the front panel 111 and in communication with the dielectric layer 21, the address electrode 12, and the third FPC 327, so that a point of contact of the third FPC 327 with the electrode 12 may be substantially sealed with the first sealing material 28 from any contact with moisture and/or impurities. Similarly, the second sealing material 29 may be deposited on a lower surface of the rear panel 211, so that a contact point between the rear panel 211, the electrode 12 and the third FPC 327 may be substantially sealed with the second sealing material 29 from any contact with moisture and/or impurities. The first and second sealing materials 28 and 29 may be on opposite sides, i.e., front and rear surfaces, respectively, of the third FPC 327.

The third FPC 327 may be formed, e.g., as a tape carrier package (TCP) type, and include a driver IC 25 for generating control signals to be applied to the address electrodes 12. The driver IC 25 may be disposed on a bent portion 115a of the first long side 115 of the chassis base 15, as illustrated in FIG. 1. The bent portion 115a may protrude vertically in a downward direction from a lower edge of the first long side 115, as illustrated in FIG. 2. A layer of thermal grease 32 may be interposed between the driver IC 25 and the bent portion 115a to dissipate heat generated in the driver IC 25 toward the long side 115 and the chassis base 15 through the bent portion 115a.

A thermally conductive pad 33 may be disposed on the driver IC 25, i.e., such that the driver IC 25 may be positioned between the thermal grease 32 and the thermally conductive pad 33, to protect the driver IC 25 and to absorb and conduct heat generated in the driver IC 25. A cover plate 34 may be mounted on the bent portion 115a of the chassis base 15 to support the thermally conductive pad 33 and cover the third FPC 327. A screw 19 may be used to attach the cover plate 34 to the thermally conductive pad 33, the driver IC 25, and the bent portion 115a. The cover 34 may be positioned along the long side 115 of the chassis base 15 to cover the plurality of third FPCs 327. In addition, the cover plate 34 may discharge heat through the thermally conductive pad 33. Accordingly, a front and a rear surface of the driver IC 25, i.e., surface in the xy-plane, of the third FPC 327 may be protected by the bent portion 115a and the cover plate 34, respectively, from impurities. Additionally, a fan (not shown) may be provided to discharge the dispersed impurities outside of the space. Alternatively, a cover (not shown) may be included to change the dispersion direction of the impurities.

Figure 3:
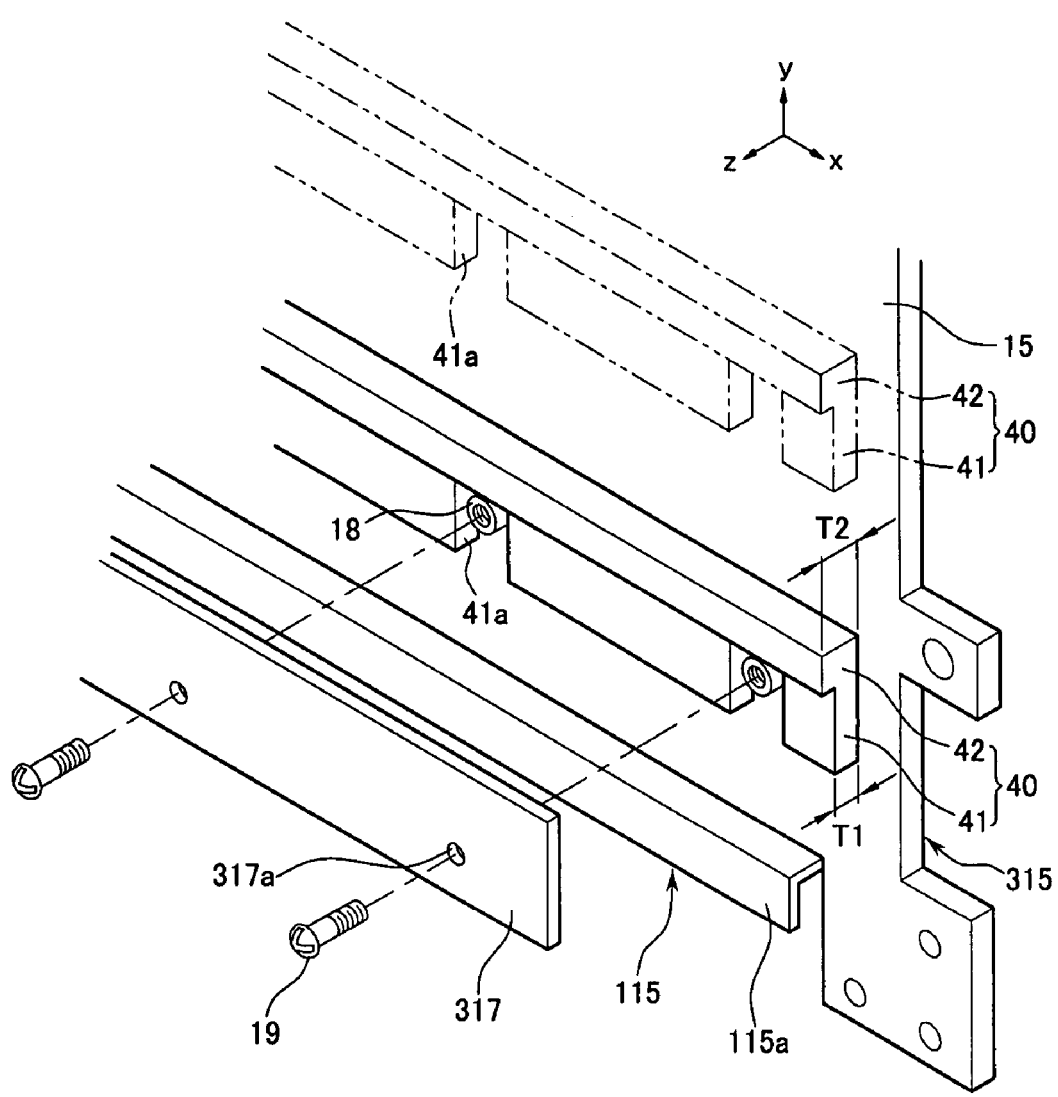
FIG. 3 illustrates a partial exploded perspective view of a chassis base, an address buffer board, and an insert member in the plasma display device illustrated in FIGS. 1-2.

The insert member 40, as illustrated in FIG. 3, may be inserted between the chassis base 15 and the address buffer board 317 to block dropping dispersed impurities. The insert member 40 may include an insert portion 41 and a stopper 42. The insert portion 41 may have a first thickness T1, i.e., a distance as measured along the z-axis, substantially equal to the distance L, i.e., a distance between the chassis base 15 and the address buffer board 317. The insert portion 41 may be inserted between the chassis base 15 and the address buffer board 317. The stopper 42 may be formed in communication with an upper edge of the insert portion 41 and perpendicularly thereto. The stopper 42 may have a second thickness T2 that may be greater than the distance L, so that the stopper 42 may be in communication with an upper portion of the address buffer board 317, as illustrated in FIG. 2. Alternatively, the insert member 40 may include only the insert portion 41.

The insert portion 41 may include inserting grooves 41a along the z-axis corresponding to the bosses 18. In other words, each groove 41a may be formed through the insert portion 41 along the z-axis to facilitate insertion of a respective boss 18 of the chassis base 15 therethrough, so that upon mounting of the address buffer board 317 on the chassis base 15 with the insert member 41 therebetween, the inserting grooves 41a of the insert member 41 may provide a means for inserting screws 19 through engaging holes 317a into the bosses 18. The insert member 40 may be made of a flexible insulating resin pressed between the chassis base 15 and the address buffer board 317, for example, in order to absorb vibrations and noise generated in the address buffer board 317.

Formation of the insert member 40 and insertion thereof between the address buffer board 317 and the chassis base 15 may be advantageous in blocking impurities from dispersion into the space S, thereby, minimizing the amount of impurities in the driver IC 25 and the FPC 327. The insert member 40 may block vibration, absorb sounds, reduce electromagnetic interference and static electricity, ground the address buffer board 317, and dissipate heat of the address buffer board 317. Additionally, formation of the bent portion 115a and the cover plate 34 may shield the driver IC 25 and the third FPC 327 from impurities separating and dropping from the PCBs 17 and elements mounted thereon (not shown) toward a bottom of the plasma display device upon driving of the PDP 11.

Figure 4:
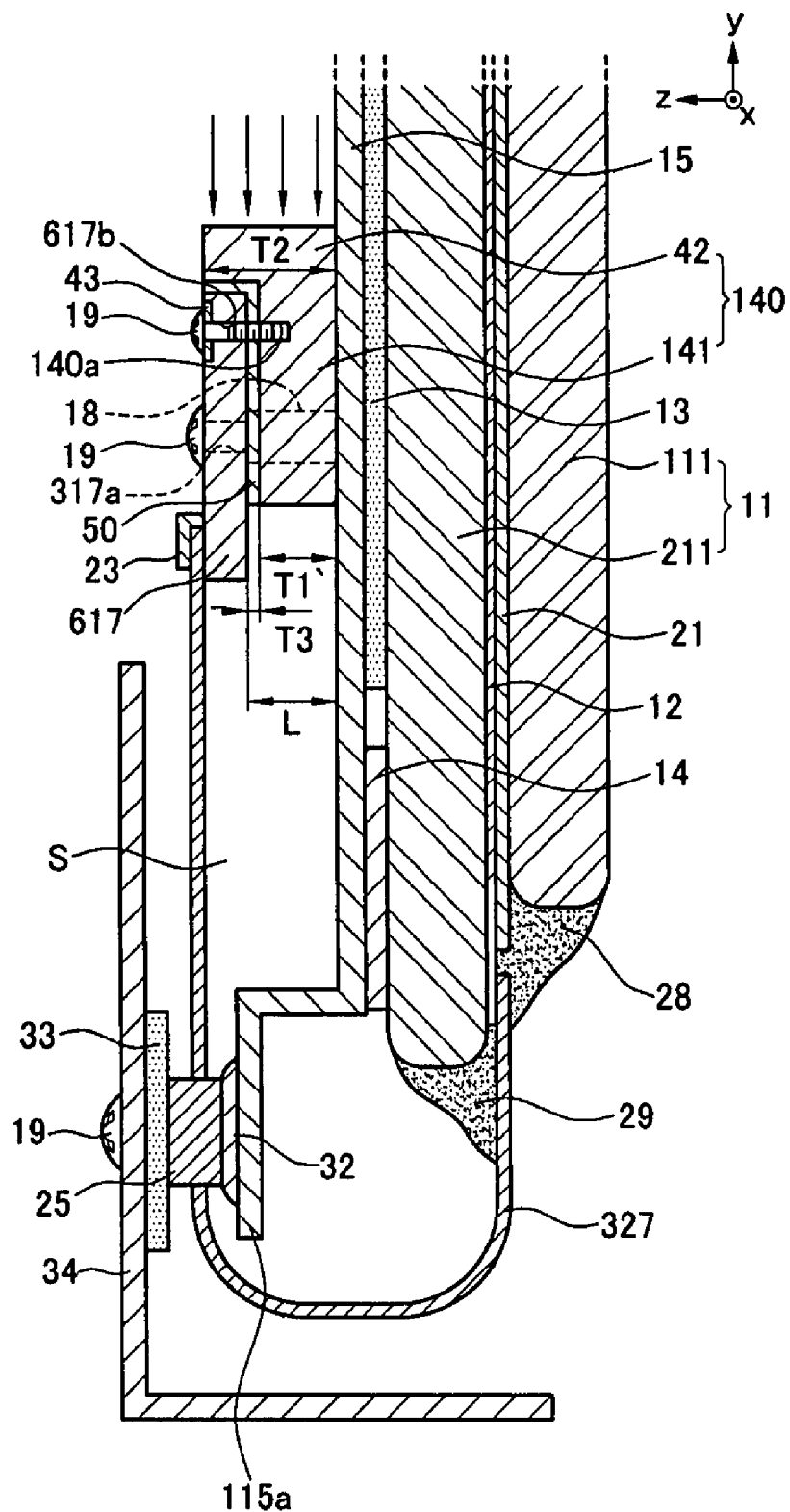
FIG. 4 illustrates a cross sectional view of a plasma display device according to another embodiment of the present invention.
Figure 5:
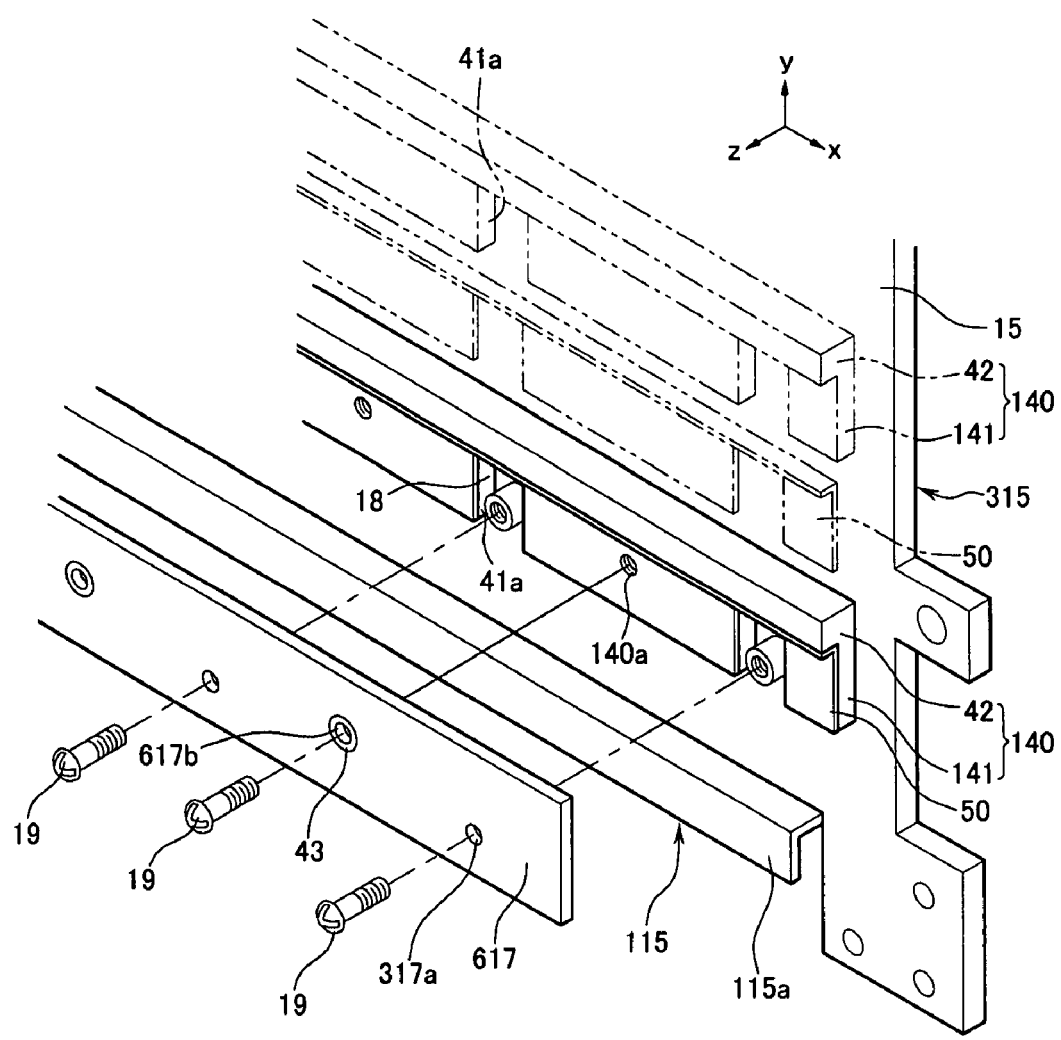
FIG. 5 illustrates an exploded perspective view of a chassis base, an address buffer board, and an insert member in the plasma display device illustrated in FIG. 4.

According to another embodiment of the present invention illustrated in FIGS. 4-5, a plasma display device may be similar to the plasma display device described previously with respect to FIGS. 1-3, with the exception of including a vibration blocking member 50 between an insert member 140 and an address buffer board 617. The vibration blocking member 50 may have a third thickness T3. The vibration blocking member 50 may absorb vibrations and noise generated in the address buffer board 617 and may prevent transmission of the vibrations and the noise to the insert member 140 and the chassis base 15.

For example, if the insert member 140 is made of a conductive material to reduce electromagnetic interference and static electricity, to ground the address buffer board 617, and to dissipate heat of the address buffer board 617, the vibration blocking member 50 may be made of an insulating material between the address buffer board 617 and the insert member 140 in order to absorb vibrations and noise and to prevent a short circuit between the address buffer board 617 and the insert member 140.

The insert member 140 may be similar to the insert member 40 described previously with respect to FIGS. 1-3, with the exception that the insert member 140 may include an insert portion 141 having first holes 140a and a first thickness T1' smaller than the first thickness T1 of the insert portion 41. A sum of the first thickness T1' of the insert portion 141 and the third thickness T3 of the vibration blocking member 50 may be substantially equal to the distance L, as illustrated in FIG. 4. The holes 140a may be formed through the insert portion 141 to facilitate insertion of screws 19 therethrough.

The address buffer board 617 may be similar to the address buffer board 317 described previously with respect to FIGS. 1-3, with the exception that it may include a first ground pattern 43 and second holes 617b. The first ground pattern 43 may be formed on a rear surface of the address buffer board 617 and be connected to the chassis base 15 through the screw 19 and the insert member 140. Accordingly, when the screws 19 are inserted through the second holes 617b formed in the address buffer board 617 into the first holes 140a of the insert member 140, the insert member 140 may be grounded through the first ground pattern 43, thereby grounding the chassis base 15.

Figure 6:
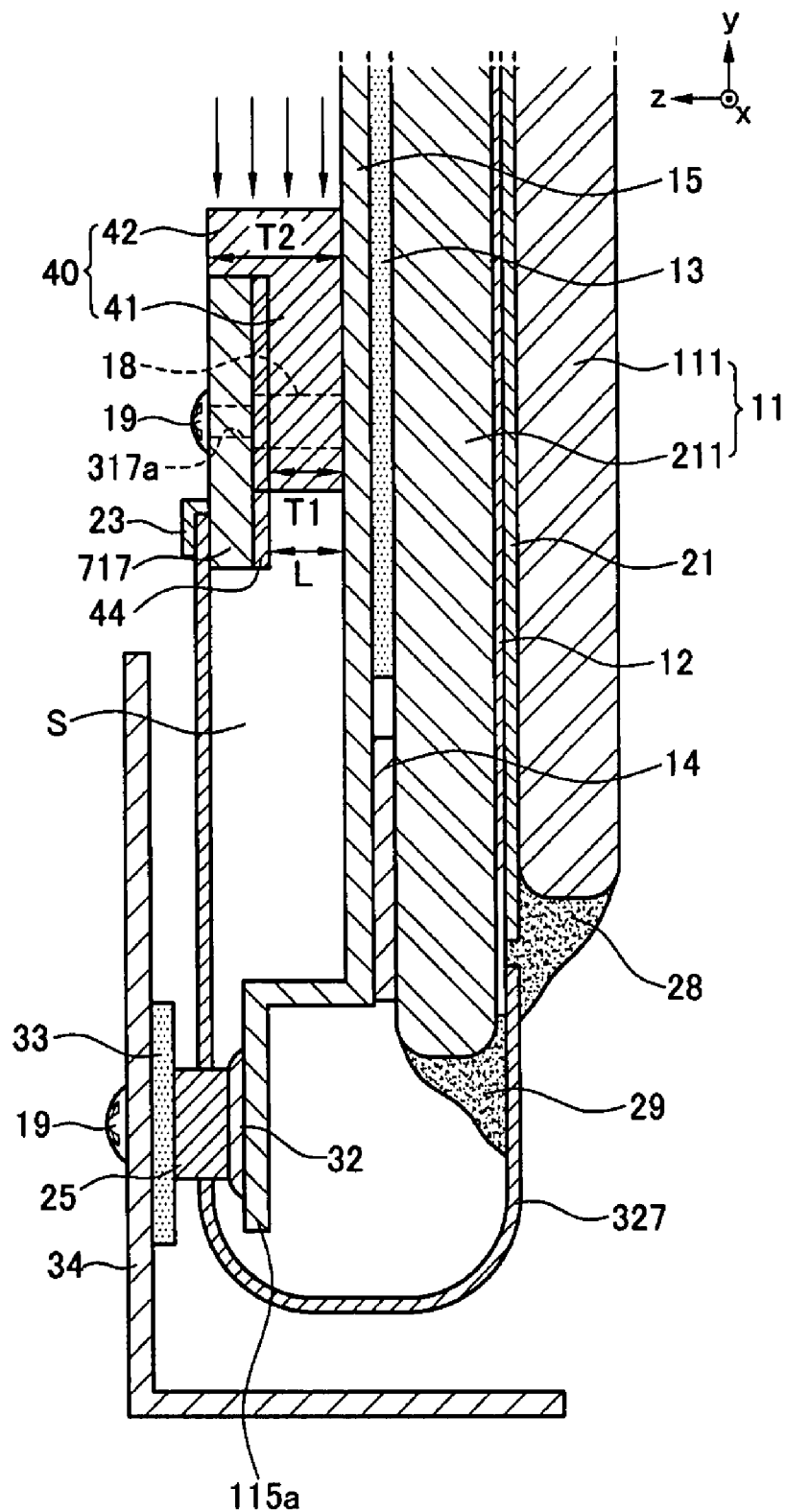
FIG. 6 illustrates a cross sectional view of a plasma display device according to another embodiment of the present invention.

According to yet another embodiment of the present invention, illustrated in FIG. 6, a plasma display device may be similar to the plasma display device described previously with respect to FIGS. 1-3, with the exception of having an address buffer board 717 with a second ground pattern 44. The second ground pattern 44 may be formed on a front surface, i.e., an entire surface or a portion thereof, of the address buffer board 717. In particular, the second ground pattern 44 may be positioned between the address buffer board 717 and the insert member 40. If the second ground pattern 44 is formed on a portion of the front surface of the address buffer board 717, portions of the address buffer board 717 that are not in communication with the second ground pattern 44 may be coated with an insulating layer (not shown). The second ground pattern 44 may have an area larger than the area of the first ground pattern 43 described previously with respect to FIGS. 4-5, and therefore, the second ground pattern 44 may provide an improved ground performance.

As described above, the plasma display device according to an embodiment of the present invention may include an insert member between the chassis base and the PCB to fill a space therebetween and, thereby, prevent penetration of impurities into the FPC or driver IC package.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A plasma display device, comprising:
a plasma display panel having a front panel, a rear panel, and a plurality of electrodes therebetween;
a chassis base affixed to the rear panel of the plasma display panel;
a plurality of printed circuit boards on the chassis base;
a plurality of flexible printed circuits electrically connecting the printed circuit boards to the electrodes, each printed circuit board being between the chassis base and a corresponding flexible printed circuit; and
an insert member between the chassis base and the printed circuit boards, at least a portion of a driver IC being in a space defined by the insert member with the chassis base, a corresponding printed circuit board, and a corresponding flexible printed circuit, the insert member including:
an insert portion between the chassis base and the printed circuit board, and
a stopper in communication with the insert portion and an upper surface of the printed circuit board, a thickness of the stopper being greater than a distance between the chassis base and the printed circuit board, and the stopper in contact with and covering an outermost edge of the printed circuit board, the outermost edge of the printed circuit board being in a plane substantially perpendicular to a plane of a major surface of the front panel.

2. The plasma display device as claimed in claim 1, wherein the printed circuit boards include an address buffer board connected to address electrodes.

3. The plasma display device as claimed in claim 2, wherein the address buffer board is connected to the address electrodes through a flexible printed circuit having the driver IC.

4. The plasma display device as claimed in claim 1, wherein a first thickness of the insert portion substantially equals a distance between the chassis base and the printed circuit board.

5. The plasma display device as claimed in claim 1, wherein the insert portion includes inserting grooves corresponding to respective bosses in the chassis base.

6. The plasma display device as claimed in claim 1, wherein the insert member includes an insulating material.

7. The plasma display device as claimed in claim 1, further comprising a vibration blocking member between the insert member and the printed circuit board.

8. The plasma display device as claimed in claim 7, wherein the insert member includes a conductive material.

9. The plasma display device as claimed in claim 8, wherein the vibration blocking member is an insulator.

10. The plasma display device as claimed in claim 7, wherein a sum of a first thickness of the insert portion and a third thickness of the vibration blocking member substantially equals to a distance between the chassis base and the printed circuit board.

11. The plasma display device as claimed in claim 7, wherein the printed circuit board has a first ground pattern electrically connected to the insert member by a screw.

12. The plasma display device as claimed in claim 1, wherein the printed circuit board has a second ground pattern on at least a portion of a surface of the printed circuit board.

13. The plasma display device as claimed in claim 1, wherein the insert portion and the stopper are integral.

14. The plasma display device as claimed in claim 1, wherein the flexible printed circuit and the insert member are on opposite surfaces of the printed circuit board.

15. The plasma display device as claimed in claim 1, wherein the insert member overlaps at least two surfaces of the printed circuit board, the two surfaces of the printed circuit board being in different planes.

16. A plasma display device, comprising:
a plasma display panel having a front panel, a rear panel, and a plurality of electrodes therebetween;
a chassis base affixed to the rear panel of the plasma display panel;
a plurality of printed circuit boards on the chassis base, each printed circuit board electrically connected to the electrodes via a flexible printed circuit; and
an insert member between the chassis base and the printed circuit boards, the insert member including:

an insert portion between the chassis base and the printed circuit board, a first thickness of the insert portion being substantially equal to a distance between the chassis base and the printed circuit board, and a stopper in communication with the insert portion and an upper surface of the printed circuit board, a second thickness of the stopper being greater than a distance between the chassis base and the printed circuit board, and the stopper in contact with and covering an outermost edge of the printed circuit board, the outermost edge of the printed circuit board being in a plane substantially perpendicular to a plane of a major surface of the front panel.

17. A plasma display device, comprising:

a plasma display panel having a front panel, a rear panel, and a plurality of electrodes therebetween;

a chassis base affixed to the rear panel of the plasma display panel;

a plurality of printed circuit boards on the chassis base, each printed circuit board electrically connected to the electrodes via a flexible printed circuit; and an insert member between the chassis base and the printed circuit boards, the insert member including:

an insert portion between the chassis base and the printed circuit board, a stopper in communication with the insert portion and an upper surface of the printed circuit board, a second thickness of the stopper being greater than a distance between the chassis base and the printed circuit board, and the stopper in contact with and covering an outermost edge of the printed circuit board, the outermost edge of the printed circuit board being in a plane substantially perpendicular to a plane of a major surface of the front panel, and a vibration blocking member between the insert member and the printed circuit board, a sum of a first thickness of the insert portion and a third thickness of the vibration blocking member being substantially equal to a distance between the chassis base and the printed circuit board.

* * * * *